United States Patent [19]

Yamada et al.

[11] Patent Number: 4,929,320
[45] Date of Patent: May 29, 1990

[54] METHOD OF MAKING MAGNETO-OPTICAL RECORDING MEDIUM

[75] Inventors: Takashi Yamada; Masaaki Nomura; Ryoichi Yamamoto; Satoshi Matsubaguchi; Akira Nahara, all of Odawara, Japan

[73] Assignee: Fuji Photo Film Co., Ltd., Kanagawa, Japan

[21] Appl. No.: 368,107

[22] Filed: Jun. 19, 1989

Related U.S. Application Data

[63] Continuation of Ser. No. 179,022, Apr. 7, 1988, abandoned, which is a continuation-in-part of Ser. No. 36,484, Apr. 9, 1987, abandoned.

[30] Foreign Application Priority Data

Apr. 11, 1986 [JP] Japan ................ 62-83720
Apr. 10, 1987 [JP] Japan ................ 62-87974

[51] Int. Cl.$^5$ .................................. C23C 14/34
[52] U.S. Cl. .................. 204/192.2; 204/192.15
[58] Field of Search ............. 204/192.12, 192.15, 204/192.2, 298 TS, 298 SC, 298 MR

[56] References Cited

U.S. PATENT DOCUMENTS

| | | | |
|---|---|---|---|
| 4,260,466 | 4/1981 | Shirahata et al. | 304/192.2 |
| 4,367,257 | 1/1983 | Arai et al. | 204/192.2 X |
| 4,525,262 | 6/1985 | Class et al. | 204/192.12 X |
| 4,576,699 | 3/1986 | Sato et al. | 204/192.2 X |
| 4,608,142 | 8/1986 | Gomi et al. | 204/192.2 |
| 4,684,454 | 8/1987 | Gardner | 204/192.2 |

FOREIGN PATENT DOCUMENTS 0215013 12/1983 Japan .................. 204/192.2

OTHER PUBLICATIONS

L. D. Locker et al., "Preparation . . . Sputtering", J. Electrochem. Soc. vol. 118, No. 11, 11/71, pp. 1856–1862.
Kay et al., "Controlled Sputtering Process", IBM Tech. Disclosure Bull., vol. 12, No. 9, 2/70, 1358.

*Primary Examiner*—Nam X. Nguyen
*Attorney, Agent, or Firm*—Sixbey, Friedman, Leedom & Ferguson

[57] ABSTRACT

A method of making a magneto-optical recording medium comprises the step of forming a magneto-optical recording layer on a substrate by simultaneously carrying out direct current sputtering and radio-frequency sputtering. Alternatively, a magneto-optical recording layer composed of thin rare earth metal layers and thin transition metal layers overlaid alternately on a substrate is formed by carrying out radio-frequency sputtering by use of a target formed of a rare earth metal material and direct current sputtering by use of a target formed of a transition metal material.

9 Claims, 2 Drawing Sheets

METHOD OF MAKING MAGNETO-OPTICAL RECORDING MEDIUM

This is a continuation of Ser. No. 179,022, filed 4/7/88, now abandoned, which is a continuation-in-part application of application Ser. No. 036,484 filed Apr. 9, 1987 now abandoned.

BACKGROUND OF THE INVENTION

1. Field of the Invention

This invention relates to a method of making a magneto-optical recording medium such as magneto-optical disk used for large-capacity data files or the like. This invention particularly relates to a method of forming a magneto-optical recording layer of the magneto-optical recording medium by a sputtering process.

2. Description of the Prior Art

Optical recording media have various advantages such that they can record information at a high density, have a large capacity, and need not be contacted with a head. Among such optical media, the magneto-optical recording medium has attracted particular attention for enabling easy erasing and rerecording.

The magneto-optical recording medium is composed of a magnetic material as a recording medium material, and records information based on changes in magnetization of the magnetic material. For example, an amorphous magnetic material composed of a combination of a rare earth metal such as Gd, Tb or Dy with a transition metal such as Fe, Co or Ni is used as the magnetic material. The magnetic material is used in a layer form as a recording layer.

The recording layer has heretofore been formed by sputtering processes. Among the sputtering processes, a direct current sputtering process is considered to be efficient since the process has the advantages that it is easy to increase the film forming speed and that film formation is possible at low temperatures and it is easy to maintain a magnetic material in the amorphous condition.

However, the direct current sputtering process has the drawback that the molecule density of the recording layer formed by the process is lower than the molecule density of a recording layer formed by the radio-frequency sputtering process, and adhesion of the recording layer to a substrate is also low.

On the other hand, for such reasons that the vertical magnetic anisotropy should be increased, a recording layer may be formed by alternately overlaying the thin layers of a rare earth metal and thin layers of a transition metal. In this case, formation of both the thin rare earth metal layers and the thin transition metal layers by direct current sputtering is advantageous over the formation by radio-frequency sputtering in that the film formation can be achieved at low temperatures and it is easy to increase the film forming speed. However, with the formation by direct current sputtering, the aforesaid problems as well as the problems with regard to deterioration of the squareness ratio and the initial C/N ratio and an increase in deterioration of properties with the passage of time arise.

SUMMARY OF THE INVENTION

The primary object of the present invention is to provide a first method of making a magneto-optical recording medium which enables an increase in the film forming speed, and maintaining of a substrate at low temperatures in the course of film formation.

Another object of the present invention is to provide a first method of making a magneto-optical recording medium, which enables formation of a magneto-optical recording layer having a high molecule density and high adhesion to the substrate.

A further object of the present invention is to provide a second method of making a magneto-optical recording medium, which enables an increase in the film forming speed, maintaining of a substrate at low temperatures in the course of film formation, and formation of a magneto-optical recording layer having a high molecule density and high adhesion to the substrate in the case where the magneto-optical recording layer comprises thin rare earth metal layers and thin transition metal layers overlaid alternately.

A still further object of the present invention is to provide a second method of making a magneto-optical recording medium, which enables film formation at low temperatures, an increase in the film forming speed, and improvement in the squareness ratio, the initial C/N ratio and deterioration of properties with the passage of time.

The first method of making a magneto-optical recording medium in accordance with the present invention is characterized by forming a magneto-optical recording layer on a substrate by simultaneously carrying out direct current sputtering capable of achieving a high film forming speed and maintaining the substrate at low temperatures in the course of film formation, and radio-frequency sputtering capable of forming the recording layer having a high molecule density and high adhesion to the substrate.

The substrate is constituted by a material exhibiting a high transmittance to recording light and reproducing light, for example, glass or a plastic material (such as PMMA, PC, or an epoxy resin), a metal such as Al or duralumin, or a ceramic material such as CaO, MgO or ZrO. The substrate is formed to a thickness of, for example, approximately 1 mm. The substrate material is selected from these transparent materials and the opaque materials in accordance with the purpose of use.

By the term "direct current sputtering" as used herein is generically meant sputtering carried out by applying a DC voltage across a target and a substrate, for example, a direct current two-pole sputtering process or a bias sputtering process.

By "radio-frequency sputtering" is meant sputtering carried out by applying an AC voltage across a target and a substrate. For example, in a typical radio-frequency sputtering process, an AC voltage having a frequency of 13.56 MHz is used. The term "simultaneously carrying out direct current sputtering and radio-frequency sputtering" as used herein means that the magneto-optical recording layer is formed by utilization of direct current sputtering and radio-frequency sputtering in common. The utilization in common may effected in any manner insofar as the magneto-optical recording layer can be imparted with the advantages of direct current sputtering and the advantages of radio-frequency sputtering. For example, metal atoms sputtered from targets disposed above the substrate for effecting direct current sputtering and radio-frequency sputtering may be mixed approximately uniformly in the thickness direction to form the recording layer. Alternatively, direct current sputtering may be carried out for one of two opposed half regions on one surface of the substrate, radio-frequency sputtering may be carried out for the other of the two opposed half regions, and the substrate may be rotated with respect to both the targets corresponding to direct current sputtering and radio-frequency sputtering approximately at a predetermined speed, thereby to form a recording layer composed of radio-frequency sputtering layers and direct current sputtering layers overlaid alternately. The targets for direct current sputtering and radio-frequency sputtering may be formed of the same material (for example, TbFeCo) or different materials (for example, TbFe and TbCo, or Tb and FeCo).

The second method of making a magneto-optical recording medium in accordance with the present invention is characterized by forming a magneto-optical recording layer composed of thin rare earth metal layers and thin transition metal layers overlaid alternately on a substrate by carrying out radio-frequency sputtering by use of a target formed of a rare earth metal material and direct current sputtering by use of a target formed of a transition metal material.

The terms "substrate", "direct current sputtering" and "radio-frequency sputtering" as used herein with reference to the second method of making a magneto-optical recording medium in accordance with the present invention may be interpreted in the same manner as in the first method of making a magneto-optical recording medium in accordance with the present invention.

Also, the layer configuration by the thin rare earth metal layers and the thin transition metal layers may be formed by alternately carrying out radio-frequency sputtering and direct current sputtering, or may be formed in any other manner. For example, direct current sputtering may be carried out for one of two opposed half regions on one surface of the substrate, radio-frequency sputtering may be carried out for the other of the two opposed half regions, and the substrate may be rotated with respect to both the targets corresponding to direct current sputtering and radio-frequency sputtering approximately at a predetermined speed. With this technique, though the thin transition metal layers and the thin rare earth metal layers are respectively formed in a spiral condition in their thickness directions, the cross-sectional configuration of the overall recording layer in its thickness direction is formed so that the thin transition metal layers and the thin rare earth metal layers are overlaid alternately.

Also, the thickness of each thin transition metal layer and the thickness of each thin rare earth metal layer are respectively adjusted to be within the range of several angstroms to several tens of angstroms.

With the first method of making a magneto-optical recording medium in accordance with the present invention wherein the magneto-optical recording layer is formed by simultaneously carrying out direct current sputtering and radio-frequency sputtering which have the advantages different from each other, the magneto-optical recording layer can be formed on the substrate by the utilization of the advantages of both sputtering processes.

Specifically, it is possible to increase the speed of formation of the recording layer and to maintain the substrate at a low temperature in the course of the formation of the recording layer by the utilization of direct current sputtering. Since the substrate can be maintained at a low temperature in the course of the formation of the recording layer, it is possible to prevent the molecules constituting the recording layer from being crystallized, to achieve the amorphous condition exhibiting good recording characteristics, and to prevent thermal deformation of the substrate. Also, it is possible to form the recording layer having a high molecule density and high adhesion to the substrate by the utilization of advantages of radio-frequency sputtering. Since the recording layer thus formed has high adhesion to the substrate, the magneto-optical recording medium made by the first method of the present invention is free from the problem with regard to peeling off of the recording layer from the substrate.

The aforesaid effects are particularly large in the case where the recording layer is formed such that the metal atoms sputtered by both sputtering processes are mixed approximately uniformly in the thickness direction of the recording layer. In the case where the metal atoms sputtered by both sputtering processes are respectively in the form of layers, the configuration may macro-wise be regarded to be identical with the configuration in the case where the metal atoms sputtered by both sputtering processes are mixed approximately uniformly in the thickness direction of the recording layer, and the aforesaid effects of the common utilization of both sputtering processes can be achieved.

With the second method of making a magneto-optical recording medium in accordance with the present invention, both sputtering processes are utilized in common, and the rare earth metal layers and the transition metal layers overlaid alternately are formed as thin layers. Therefore, this case can macro-wise be regarded to be identical with the case where the metal atoms sputtered by both sputtering processes are mixed approximately uniformly in the thickness direction of the recording layer, and the same effects as with the first method of making a magneto-optical recording medium in accordance with the present invention can be achieved. Also, with the second method in accordance with the present invention wherein the thin rare earth metal layers are formed by radio-frequency sputtering and the thin transition metal layers are formed by direct current sputtering, the micro-wise effects in the unit of each thin layer can also be obtained. Specifically, since the thin transition metal layers are formed by direct current sputtering, film formation at low temperatures and quick film formation can be achieved. Also, since the thin rare earth metal layers are formed by radio-frequency sputtering, the squareness ratio and the initial C/N ratio can be increased, and deterioration of properties with the passage of time can be minimized.

Also, by virtue of the film formation at low temperatures and quick film formation, it is possible to avoid the problem that the thin layers are exposed to much residual oxygen and moisture for a long period, and to form thin layers exhibiting high weathering resistance, and consequently a magneto optical recording layer exhibiting high weathering resistance.

DESCRIPTION OF THE PREFERRED EMBODIMENTS

The present invention will hereinbelow be described in further detail with reference to the accompanying drawings.

Figure 1:
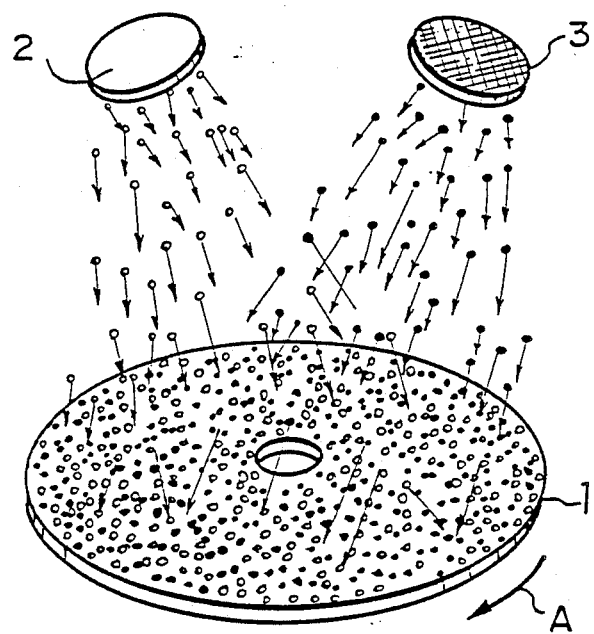
FIG. 1 is an explanatory view showing an embodiment of the first method of making a magneto-optical recording medium in accordance with the present invention.

With reference to FIG. 1, a disk-like transparent substrate 1 is rotated in a predetermined direction, i.e. in the direction as indicated by the arrow A, in a vacuum chamber. Direct current sputtering (hereinafter abbreviated as DC sputtering) by use of a target 2 disposed just above the transparent substrate 1 and radio frequency sputtering (hereinafter abbreviated as RF sputtering) by use of a target 3 are carried out simultaneously. In this manner, a thin metal layer is formed as a magneto-optical recording layer on the transparent substrate 1.

The transparent substrate 1 may be formed of any material insofar as it exhibits a high transmittance to recording light and reproducing light. For example, glass, or a plastic resin such as PC, PMMA or an epoxy resin may be used for this purpose.

The rotation speed of the transparent substrate 1 is adjusted by considering the sputtering speed to such a value that the recording layer having a uniform thickness is formed over the overall transparent substrate 1. For example, the rotation speed is adjusted to 30 r.p.m.

The rotating direction of the transparent substrate 1 may be reverse to the direction of the arrow A.

DC sputtering is carried out by applying a predetermined DC voltage across the transparent substrate 1 (anode) and the target 2 (cathode), and generating plasma to form the recording layer on the transparent substrate 1. DC sputtering may be of various types, for example, a direct current two-pole type, a bias type, and a getter type. The DC voltage is adjusted so that the electric power is within the range of, for example, 100 W to 500 W.

RF sputtering is carried out by applying a predetermined radio-frequency voltage across the transparent substrate 1 and the target 3, and generating plasma to form the recording layer on the transparent substrate 1. The radio-frequency voltage is adjusted so that the electric power is within the range of, for example, 100 W to 1 kW, depending on the level of the aforesaid DC voltage. As the frequency of the radio-frequency voltage, 13.56 MHZ is generally used. However, the frequency of the radio-frequency voltage may be higher or lower than this value.

The materials of the targets 2 and 3 are fixed by the material of the recording layer which is to be formed on the transparent substrate 1. As the material of the recording layer, any material may be used insofar as magneto-optical recording is possible with the material, for example, an amorphous rare earth metal-transition metal alloy such as GdFe, TbFe, DyFe, GdTbFe, TbDyFe, TbFeCo, GdFeCo, GdTbCo, or GdTbFeCo.

Accordingly, in the case where the recording layer is to be formed of, for example, the TbFeCo alloy, at least either one of the targets 2 and 3 must contain metals Tb, Fe and Co as the constituents. However, the constituents of the targets 2 and 3 may be selected in any combination. For example, both the targets 2 and 3 may be formed of the TbFeCo alloy. Or, the target 2 may be formed of the Fe metal, and the target 3 may be formed of a TbCo alloy. Alternatively, the target 2 may be formed of TbFe, and the target 3 may be formed of TbCo.

The positions, the sizes and the sputtering directions of the targets 2 and 3 may be selected as desired to achieve a high sputtering efficiency.

The simultaneous operation of DC sputtering and RF sputtering is achieved by almost simultaneously applying voltages to both the targets 2 and 3, and metal molecules sputtered thereby from the targets 2 and 3 are uniformly mixed together in the thickness direction to form the recording layer on the transparent substrate 1. When the thickness of the recording layer increases up to the predetermined value, application of voltages to the targets 2 and 3 is stopped. In the case where the electric power fed to the target 2 is 300 W, the electric power fed to the target 3 is 1 kW, and the conditions such as the positions, the sizes and the sputtering directions of the targets 2 and 3 are adjusted to appropriate conditions, it is necessary to continue DC sputtering and RF sputtering for, for example, five minutes in order to form the recording layer to a thickness of 1,000 Å.

The vacuum chamber is first evacuated to approximately $10^{-5}$ Torr, and then Ar gas is introduced thereinto up to a vacuum of approximately $10^{-3}$ Torr.

When DC sputtering and RF sputtering are carried out simultaneously as mentioned above, it becomes possible to compensate for defects of both sputtering processes by appropriately combining the advantages of the sputtering processes.

The number of the targets 2 and 3 is not limited to the number in the aforesaid embodiment. For example, in order to increase the film forming speed, the number of the targets may be increased.

In the aforesaid embodiment, simultaneous sputtering on the transparent substrate 1 is carried out by controlling the voltages applied to the targets 2 and 3. However, simultaneous sputtering may also be achieved in various other manners. For example, simultaneous sputtering may be carried out by disposing a shutter between the transparent substrate 1 and the targets 2, 3, and starting the film formation at the time desired sputtering conditions are achieved by the control of opening/closing of the shutter.

An embodiment of the second method of making a magneto-optical recording medium in accordance with the present invention will hereinbelow be described with reference to FIGS. 2 and 3.

Figure 2:
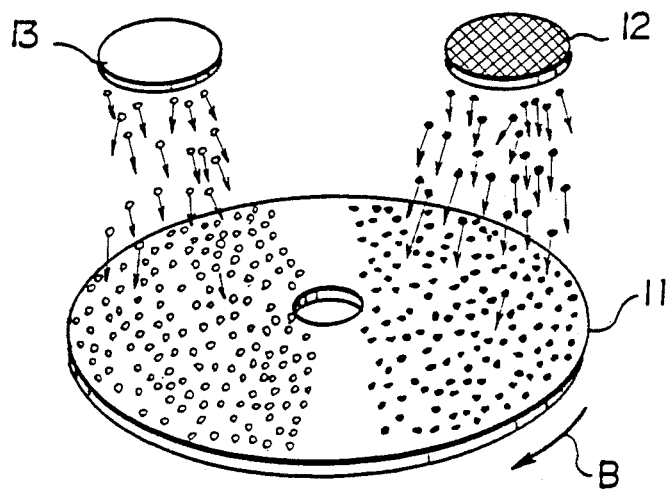
FIG. 2 is an explanatory view showing an embodiment of the second method of making a magneto-optical recording medium in accordance with the present invention.

With reference to FIG. 2, a disk-like transparent substrate 11 is rotated in a predetermined direction, i.e. in the direction as indicated by the arrow B. DC sputtering is carried out by use of a transition metal target 12 disposed just above the transparent substrate 11, and RF sputtering is carried out by use of a rare earth metal target 13. In this manner, thin transition metal layers and thin rare earth metal layers are alternately overlaid on the transparent substrate 11, thereby to form a magneto-optical recording layer.

The rotation speed of the transparent substrate 11 is adjusted by considering the sputtering speed so that the thickness of each of the thin metal layers becomes equal to a desired value.

The direction of rotation of the transparent substrate 11 may be reverse to the direction as indicated by the arrow B.

Also, the transition metal target 12 and the rare earth metal target 13 should be disposed at such positions that sputtering can be carried out efficiently, and should preferably be disposed so that sputtering by the transition metal target 12 and sputtering by the rare earth metal target 13 can approximately cover the opposed semicircular regions of the transparent substrate 11 respectively.

The transition metal target 12 may be formed of a 3d transition metal or an alloy containing the 3d transition metal. However, the transition metal target 12 should most preferably be formed of $Fe_{1-x}Co_x$ where $0.02 \leq x \leq 0.50$, and preferably $0.02 \leq x \leq 0.30$. The rare earth metal target 13 may be formed of a rare earth metal or an alloy containing the rare earth metal. However the rare earth metal target 13 should most preferably be formed of a material containing at least one rare earth metal selected from the group consisting of Tb, Dy, Gd, Nd, Pr and Sm.

The sputtering conditions such as the applied energy and gas pressure may be approximately equal to those in the aforesaid first embodiment.

The transition metal target 12 may contain a rare earth metal in a ratio not more than approximately 20 at %, preferably in a ratio not more than approximately 10 at %, and more preferably in a ratio not more than approximately 5 at %. Also, the rare earth metal target 13 may contain a transition metal in ratio not more than approximately 20 at %, preferably in a ratio not more than approximately 10 at %, and more preferably in a ratio not more than approximately 5 at %. The transition metal target 12 and the rare earth metal target 13 may also contain metals such as Bi, Mo, Pt, Pd, Si, W and V in a ratio within the aforesaid range.

By way of example, the thickness of the overall magneto-optical recording layer is adjusted to be within the range of approximately 500 Å to 3,000 Å.

Figure 3:
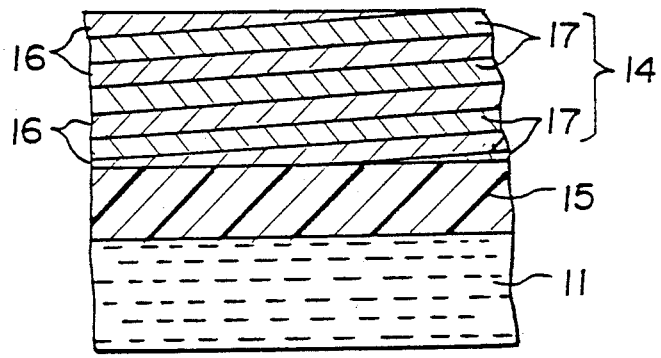
FIG. 3 is a sectional view showing the layer configuration of a magneto-optical recording medium formed by the embodiment shown in FIG. 2.

FIG. 3 schematically shows the layer configuration of the magneto-optical recording medium prepared by the method as shown in FIG. 2. The magneto-optical recording medium comprises the transparent substrate 11 and a magneto-optical recording layer 14 formed on the transparent substrate 11. Also, a protective layer 15 composed of a dielectric layer or the like may be formed between the transparent substrate 11 and the magneto-optical recording layer 14. The protective layer 15 may be formed on the transparent substrate 11 by sputtering or vacuum evaporation prior to the formation of the magneto-optical recording layer 14.

The magneto-optical recording layer 14 comprises thin rare earth metal layers 16, 16, . . . each of which has a thickness of d1, and thin transition metal layers 17, 17, . . . each of which has a thickness of d2. The thin rare earth metal layers 16, 16, . . . and thin transition metal layers 17, 17, . . . are overlaid alternately. The thickness d1 of each of the thin rare earth metal layers 16, 16, . . . should preferably be adjusted to a value satisfying the condition of $5 Å \leq d1 \leq 50 Å$ by considering that a thickness not less than the thickness of a monomolecular layer is necessary for the presence as a film and that the thickness should be of a value enabling an increase in the vertical magnetic anisotropy. Also, the thickness d2 of each of the thin transition metal layers 17, 17, . . . should preferably be adjusted to a value satisfying the condition of $0.9 \leq d2/d1 \leq 1.8$ by considering the content ratio of the transition metal in the overall recording layer.

When the magneto-optical recording layer 14 composed of the aforesaid layers is considered macro-wise as the overall recording layer, the magneto-optical recording layer 14 is a mixture layer of the rare earth metal with the transition metal. On the other hand when the magneto-optical recording layer 14 is considered micro-wise by taking each of the thin layers 16, 16, . . . and the thin layers 17, 17, . . . as a unit, the magneto-optical recording layer 14 may be regarded as a layer in which the rare earth metal and the transition metal are overlaid one upon the other without losing the characteristics thereof. Specifically, the magneto-optical recording layer 14 can macro-wise be regarded as a layer composed of a rare earth metal-transition metal alloy formed by use of DC sputtering and RF sputtering. Therefore, quick film formation and the film formation at low temperatures can be achieved by the utilization of the characteristics of DC sputtering. Also, an increase in the density of the recording layer 14 and an increase in the adhesion of the recording layer 14 to the substrate 11 can be achieved by the utilization of the characteristics of RF sputtering. With the embodiment shown in FIG. 2, the area at which the thin rare earth metal layer 16 formed by RF sputtering directly contacts the substrate 11 is nearly the half area of the substrate 11. At the other half area of the substrate 11, the thin rare earth metal layer 16 contacts the substrate 11 via the thin transition metal layer 17. However, the thin transition metal layer 17 is very thin as mentioned above, and the effect of the utilization of RF sputtering on an increase in the adhesion of the recording layer 14 to the substrate 11 is obtained also at the aforesaid other half area of the substrate 11.

On the other hand, when the magneto-optical recording layer 14 is considered micro-wise by taking each of the aforesaid thin layers as a unit, the thin transition metal layers 17, 17, . . . can be quickly formed at low temperatures by virtue of DC sputtering used for the formation of thereof. Also, since the formation of the thin rare earth metal layers 16, 16, . . . is carried out by RF sputtering, the thin rare earth metal layers 16, 16, . . . capable of improving the squareness ratio and the initial C/N ratio and minimizing the deterioration in properties with the passage of time can be formed. As the thin transition metal layers 17, 17, . . . can be quickly formed at low temperatures, the recording layer 14 can be formed quickly at low temperatures, generation of oxygen from the neighboring area can be minimized, and the time for which the recording layer 14 is exposed to the residual oxygen can be made short. In general, the thin transition metal layers 17, 17, . . . are formed to be thicker than the thin rare earth metal layers 16, 16, . . ., the effect of decreasing the adverse effects of oxygen by carrying out the formation of the thin transition metal layers 17, 17, . . . by the utilization of DC sputtering is large.

The thickness of each of the thin transition metal layers 17, 17, . . . and the thickness of each of the thin rare earth metal layers 16, 16, . . . are not limited to the values mentioned with reference to the aforesaid embodiment, and may be larger than the values mentioned with reference to the aforesaid embodiment insofar as the characteristics of the rare earth metal-transition metal alloy are not lost.

The present invention will further be illustrated by the following non-limitative examples.

EXAMPLE 1

A silicon nitride film was formed as a primary protective layer in a thickness of approximately 800 Å on a polycarbonate (PC) resin substrate at RF power of 1 kW and at an Ar gas pressure of $5\times10^{-3}$ Torr. RF sputtering was carried out for a predetermined time on 1. The measurement results are indicated in (4) in the Table below.

TABLE

|  | Tb layer forming method | FeCo layer forming method | Squareness ratio | Kerr loop squareness | Initial C/N ratio | Change in C/N ratio after 3,000 hours |
| --- | --- | --- | --- | --- | --- | --- |
| (1) Example 1 | RF sputtering | DC sputtering | 1.0 | Good | 55 dB | No change |
| (2) Comp. Ex. 1 | DC sputtering | DC sputtering | 0.6 | Bad | 50 dB | Decrease by 3 dB |
| (3) Comp. Ex. 2 | RF sputtering | RF sputtering | 1.0 | Good | 53 dB | Decrease by 2 dB |
| (4) Comp. Ex. 3 | DC sputtering | RF sputtering | 0.9 | Poor | 53 dB | Decrease by 1 dB | the rotating substrate by applying RF power of 700 W to a target formed of Tb, and then DC sputtering was carried out for a predetermined time by applying DC power of 1 kW to a target formed of FeCo. This procedure was repeated to alternately overlay thin Tb layers and thin FeCo layers on the substrate, thereby to form a magneto-optical recording layer At this time, the rotation speed of the substrate was adjusted to approximately 30 r.p.m. Under these conditions, the thickness of each of the Tb layers was approximately 5 Å, the thickness of each of the layers formed of 90 at % of Fe and 10 at % of Co was approximately 6 Å, and the total film thickness of the TbFeCo layer was approximately 800 Å. A silicon nitride film was then formed as an upper protective layer in a thickness of approximately 800 Å on the surface at RF power of 1 kW and at an Ar gas pressure of $5\times10^{-3}$ Torr.

The Kerr hysteresis loop of the magneto-optical disk made by the aforesaid method was measured by use of a Kerr loop tracer using a semiconductor laser producing a laser beam having a wavelength of 830 nm, and the squareness ratio was calculated from the hysteresis curve. Also, the initial C/N ratio of the magneto-optical disk and the amount of change in the C/N ratio after passage of 3,000 hours at 60° C. and at 90% RH were measured by use of a C/N measuring apparatus. The measurement results are indicated in (1) in the Table below.

COMPARATIVE EXAMPLE 1

A magneto-optical disk was made in the same manner as in Example 1, except that DC sputtering was carried out by applying DC power of 420 W to the target formed of Tb. The evaluation tests were carried out on the magneto-optical disk in the same manner as in Example 1. The measurement results are indicated in (2) in the Table below.

COMPARATIVE EXAMPLE 2

A magneto-optical disk was made in the same manner as in Example 1, except that RF sputtering was carried out by applying RF power of 2.2 kW to the target formed of FeCo. The evaluation tests were carried out on the magneto-optical disk in the same manner as in Example 1. The measurement results are indicated in (3) in the Table below.

COMPARATIVE EXAMPLE 3

A magneto-optical disk was made in the same manner as in Example 1, except that DC sputtering was carried out by applying DC power of 420 W to the target formed of Tb, and RF sputtering was carried out by applying RF power of 2.2 kW to the target formed of FeCo. The evaluation tests were carried out on the magneto-optical disk in the same manner as in Example As is clear from the Table, with Example 1 in accordance with the present invention, it was possible to form the magneto-optical disk exhibiting a good squareness ratio, good Kerr loop squareness and a good initial C/N ratio, and free of deterioration in properties with the passage of time.

We claim:

1. A method of making a magneto-optical recording medium by forming a magneto-optical recording layer on a substrate by simultaneously sputtering a transition metal and a rare earth metal onto the substrate comprising the steps of:
   a. rotating the substrate in a predetermined direction beneath both a transition metal target and a rare earth metal target, said targets being separate from one another and each of said targets being located above a separate half region of said substrate;
   b. sputtering a rare earth metal from the rare earth metal target onto a first half region of the surface of said substrate using radio frequency sputtering while said substrate is rotating;
   c. simultaneously sputtering a transition metal from the transition metal target onto a second half region of said substrate using direct current sputtering while said substrate is rotating, and
   d. continuing to sputter both the rare earth metal and the transition metal onto the substrate as the substrate rotates to deposit a layer of uniform thickness of rare earth metal and a layer of uniform thickness of transition metal with each rotation of the substrate to produce a first helical spiral formation consisting only of a rare earth metal overlaid with a second helical spiral formation consisting only of a transition metal such that in cross-section said magneto-optical recording layer comprises a plurality of thin transition metal layers of uniform thickness parallel to one another and obliquely oriented with respect to said substrate, and a plurality of thin rare earth metal layers of uniform thickness parallel to one another and obliquely oriented with respect to said substrate wherein adjacent transition metal layers are separated by an intervening rare earth metal layer and adjacent rare earth metal layers are separated by an intervening transition metal layer.

2. A method as defined in claim 1 wherein electric power applied to said target for said direct current sputtering is within the range of 100 W to 500 W.

3. A method as defined in claim 1 wherein electric power applied to said target for said radio-frequency sputtering is within the range of 100 W to 1 kW.

4. A method as defined in claim 1 wherein said transition metal material is $Fe_{1-x}Co_x$ where $0.02 \leqq x \leqq 0.50$.

5. A method as defined in claim 4 wherein said transition metal material is $Fe_{1-x}Co_x$ where $0.02 \leqq x \leqq 0.30$.

6. A method as defined in claim 1 wherein said rare earth metal material contains at least one rare earth metal selected from the group consisting of Tb, Dy, Gd, Nd, Pr and Sm.

7. A method as defined in claim 1 wherein the thickness d1 of each of said thin rare earth metal layers is adjusted to a value satisfying the condition of $5 Å \leqq d1 \leqq 50 Å$.

8. A method as defined in claim 1 wherein the thickness d2 of each of said thin transition metal layers is adjusted to a value satisfying the condition of $0.9 \leqq d2/d1 \leqq 1.8$ where d1 denotes the thickness of each of said thin rare earth metal layers.

9. A method as defined in claim 1, in which said transition metal is provided from an alloy of FeCo and said rare earth metal is Tb.

* * * * *